US008306821B2

(12) United States Patent
Nongpiur et al.

(10) Patent No.: US 8,306,821 B2
(45) Date of Patent: *Nov. 6, 2012

(54) SUB-BAND PERIODIC SIGNAL ENHANCEMENT SYSTEM

(75) Inventors: Rajeev Nongpiur, Burnaby (CA); Phillip A. Hetherington, Moody (CA)

(73) Assignee: QNX Software Systems Limited, Kanata, Ontario (CA)

( * ) Notice: Subject to any disclaimer, the term of this patent is extended or adjusted under 35 U.S.C. 154(b) by 1427 days.

This patent is subject to a terminal disclaimer.

(21) Appl. No.: 11/757,768

(22) Filed: Jun. 4, 2007

(65) Prior Publication Data

US 2008/0004868 A1 Jan. 3, 2008

Related U.S. Application Data

(63) Continuation-in-part of application No. 10/973,575, filed on Oct. 26, 2004, now Pat. No. 7,680,652.

(51) Int. Cl.
G10L 13/06 (2006.01)

(52) U.S. Cl. ........ 704/268; 704/205; 704/206; 704/207; 704/209; 704/225; 704/226; 704/271

(58) Field of Classification Search ............. 379/406.14, 379/406.01; 704/207; 370/290
See application file for complete search history.

(56) References Cited

U.S. PATENT DOCUMENTS

| 4,238,746 A | 12/1980 | McCool et al. |
| 4,282,405 A | 8/1981 | Taguchi |
| 4,468,804 A * | 8/1984 | Kates et al. ........... 704/265 |
| 4,486,900 A | 12/1984 | Cox et al. |
| 4,531,228 A | 7/1985 | Noso et al. |
| 4,628,156 A | 12/1986 | Irvin |
| 4,630,305 A | 12/1986 | Borth et al. |
| 4,731,846 A | 3/1988 | Secrest et al. |
| 4,791,390 A | 12/1988 | Harris et al. |
| 4,811,404 A | 3/1989 | Vilmur et al. |
| 4,843,562 A | 6/1989 | Kenyon et al. |
| 4,939,685 A | 7/1990 | Feintuch |
| 4,969,192 A | 11/1990 | Chen |
| 5,027,410 A | 6/1991 | Williamson et al. |
| 5,056,150 A | 10/1991 | Yu et al. |
| 5,146,539 A | 9/1992 | Doddington et al. |

(Continued)

FOREIGN PATENT DOCUMENTS

CA 2158847 9/1994

(Continued)

OTHER PUBLICATIONS

Yang Gui et al., Adaptive Subband Wiener Filtering for Speech Enhancement using Critical-Band Gammatone Filterbank, IEEE, 2005, pp. 732-735.*

(Continued)

*Primary Examiner* — Qi Han
*Assistant Examiner* — Mark Villena
(74) *Attorney, Agent, or Firm* — Brinks Hofer Gilson & Lione

(57) ABSTRACT

A signal enhancement system reinforces signal content and improves the signal-to-noise ratio of a signal. The system detects, tracks, and reinforces non-stationary periodic signal components of a signal. The periodic signal components may represent vowel sounds or other voiced sounds. The system may detect, track, and attenuate quasi-stationary signal components in the signal.

23 Claims, 10 Drawing Sheets

U.S. PATENT DOCUMENTS

| | | | |
|---|---|---|---|
| 5,278,780 A | 1/1994 | Eguchi et al. | |
| 5,313,555 A | 5/1994 | Kamiya | |
| 5,377,276 A | 12/1994 | Terai et al. | |
| 5,400,409 A | 3/1995 | Linhard | |
| 5,406,622 A | 4/1995 | Silverberg et al. | |
| 5,408,581 A * | 4/1995 | Suzuki et al. | 704/226 |
| 5,412,735 A | 5/1995 | Engebretson et al. | |
| 5,432,859 A | 7/1995 | Yang et al. | |
| 5,459,813 A * | 10/1995 | Klayman | 704/209 |
| 5,473,702 A | 12/1995 | Yoshida et al. | |
| 5,479,517 A | 12/1995 | Linhard | |
| 5,494,886 A | 2/1996 | Kehne et al. | |
| 5,495,415 A | 2/1996 | Ribbens et al. | |
| 5,502,688 A | 3/1996 | Recchione et al. | |
| 5,526,466 A | 6/1996 | Takizawa | |
| 5,530,768 A * | 6/1996 | Yoshizumi | 381/107 |
| 5,568,559 A | 10/1996 | Makino | |
| 5,572,262 A | 11/1996 | Ghosh | |
| 5,584,295 A | 12/1996 | Muller et al. | |
| 5,590,241 A | 12/1996 | Park et al. | |
| 5,615,298 A | 3/1997 | Chen | |
| 5,617,508 A | 4/1997 | Reaves | |
| 5,641,931 A | 6/1997 | Ogai et al. | |
| 5,677,987 A | 10/1997 | Seki et al. | |
| 5,680,508 A | 10/1997 | Liu | |
| 5,692,104 A | 11/1997 | Chow et al. | |
| 5,697,084 A * | 12/1997 | Tingley | 455/276.1 |
| 5,701,344 A | 12/1997 | Wakui | |
| 5,714,997 A | 2/1998 | Anderson | |
| 5,737,719 A * | 4/1998 | Terry | 704/224 |
| 5,742,694 A | 4/1998 | Eatwell | |
| 5,819,215 A | 10/1998 | Dobson | |
| 5,845,243 A | 12/1998 | Smart | |
| 5,920,840 A | 7/1999 | Satyamurti | |
| 5,920,848 A | 7/1999 | Schutzer et al. | |
| 5,933,801 A | 8/1999 | Fink et al. | |
| 5,949,886 A | 9/1999 | Nevins et al. | |
| 5,949,888 A | 9/1999 | Gupta et al. | |
| 5,953,694 A | 9/1999 | Pillekamp | |
| 6,011,853 A | 1/2000 | Koski et al. | |
| 6,084,907 A | 7/2000 | Nagano | |
| 6,111,957 A | 8/2000 | Thomasson | |
| 6,144,336 A | 11/2000 | Preston et al. | |
| 6,163,608 A | 12/2000 | Romesburg et al. | |
| 6,167,375 A | 12/2000 | Miseki et al. | |
| 6,173,074 B1 | 1/2001 | Russo | |
| 6,175,602 B1 | 1/2001 | Gustafson et al. | |
| 6,192,134 B1 | 2/2001 | White et al. | |
| 6,199,035 B1 | 3/2001 | Lakaniemi et al. | |
| 6,219,418 B1 | 4/2001 | Eriksson et al. | |
| 6,249,275 B1 | 6/2001 | Kodama | |
| 6,282,430 B1 | 8/2001 | Young | |
| 6,285,979 B1 * | 9/2001 | Ginzburg et al. | 704/208 |
| 6,405,168 B1 | 6/2002 | Bayya et al. | |
| 6,408,273 B1 | 6/2002 | Quagliaro et al. | |
| 6,434,246 B1 | 8/2002 | Kates et al. | |
| 6,473,409 B1 | 10/2002 | Malvar | |
| 6,493,338 B1 | 12/2002 | Preston et al. | |
| 6,507,814 B1 | 1/2003 | Gao | |
| 6,587,816 B1 | 7/2003 | Chazan | |
| 6,628,781 B1 * | 9/2003 | Grundstrom et al. | 379/406.14 |
| 6,633,894 B1 | 10/2003 | Cole | |
| 6,643,619 B1 | 11/2003 | Linhard et al. | |
| 6,687,669 B1 | 2/2004 | Schrögmeier et al. | |
| 6,690,681 B1 | 2/2004 | Preston et al. | |
| 6,725,190 B1 | 4/2004 | Cohen et al. | |
| 6,732,073 B1 * | 5/2004 | Kluender et al. | 704/233 |
| 6,771,629 B1 | 8/2004 | Preston et al. | |
| 6,782,363 B2 | 8/2004 | Lee et al. | |
| 6,804,640 B1 | 10/2004 | Weintraub et al. | |
| 6,822,507 B2 | 11/2004 | Buchele | |
| 6,836,761 B1 | 12/2004 | Kawashima et al. | |
| 6,859,420 B1 | 2/2005 | Coney et al. | |
| 6,871,176 B2 | 3/2005 | Choi et al. | |
| 6,885,752 B1 * | 4/2005 | Chabries et al. | 381/321 |
| 6,891,809 B1 | 5/2005 | Ciccone et al. | |
| 6,898,293 B2 | 5/2005 | Kaulberg | |
| 6,910,011 B1 | 6/2005 | Zakarauskas | |
| 6,937,978 B2 | 8/2005 | Liu | |
| 7,020,291 B2 | 3/2006 | Buck et al. | |
| 7,117,149 B1 | 10/2006 | Zakarauskas | |
| 7,146,012 B1 | 12/2006 | Belt et al. | |
| 7,146,316 B2 | 12/2006 | Alves | |
| 7,167,516 B1 | 1/2007 | He | |
| 7,167,568 B2 | 1/2007 | Malvar et al. | |
| 7,206,418 B2 | 4/2007 | Yang et al. | |
| 7,231,347 B2 | 6/2007 | Zakarauskas | |
| 7,269,188 B2 | 9/2007 | Smith | |
| 7,272,566 B2 | 9/2007 | Vinton | |
| 2001/0005822 A1 * | 6/2001 | Fujii et al. | 704/200 |
| 2001/0028713 A1 | 10/2001 | Walker | |
| 2002/0052736 A1 | 5/2002 | Kim et al. | |
| 2002/0071573 A1 | 6/2002 | Finn | |
| 2002/0176589 A1 | 11/2002 | Buck et al. | |
| 2003/0040908 A1 | 2/2003 | Yang et al. | |
| 2003/0093265 A1 | 5/2003 | Xu et al. | |
| 2003/0093270 A1 | 5/2003 | Domer | |
| 2003/0097257 A1 | 5/2003 | Amada et al. | |
| 2003/0101048 A1 | 5/2003 | Liu | |
| 2003/0206640 A1 | 11/2003 | Malvar et al. | |
| 2003/0216907 A1 | 11/2003 | Thomas | |
| 2004/0002856 A1 | 1/2004 | Bhaskar et al. | |
| 2004/0024600 A1 | 2/2004 | Hamza et al. | |
| 2004/0071284 A1 | 4/2004 | Abutalebi et al. | |
| 2004/0078200 A1 | 4/2004 | Alves | |
| 2004/0138882 A1 | 7/2004 | Miyazawa | |
| 2004/0165736 A1 | 8/2004 | Hetherington et al. | |
| 2004/0167777 A1 | 8/2004 | Hetherington et al. | |
| 2004/0179610 A1 | 9/2004 | Lu et al. | |
| 2005/0075866 A1 | 4/2005 | Widrow | |
| 2005/0111683 A1 * | 5/2005 | Chabries et al. | 381/317 |
| 2005/0114128 A1 | 5/2005 | Hetherington et al. | |
| 2005/0240401 A1 | 10/2005 | Ebenezer | |
| 2006/0034447 A1 * | 2/2006 | Alves et al. | 379/406.01 |
| 2006/0056502 A1 | 3/2006 | Callicotte | |
| 2006/0074646 A1 | 4/2006 | Alves et al. | |
| 2006/0089958 A1 | 4/2006 | Giesbrecht et al. | |
| 2006/0089959 A1 * | 4/2006 | Nongpiur et al. | 708/300 |
| 2006/0100868 A1 | 5/2006 | Hetherington et al. | |
| 2006/0115095 A1 | 6/2006 | Giesbrecht et al. | |
| 2006/0116873 A1 | 6/2006 | Hetherington et al. | |
| 2006/0251268 A1 | 11/2006 | Hetherington et al. | |
| 2006/0287859 A1 | 12/2006 | Hetherington et al. | |
| 2007/0033031 A1 | 2/2007 | Zakarauskas | |
| 2007/0136055 A1 | 6/2007 | Hetherington | |

FOREIGN PATENT DOCUMENTS

| | | |
|---|---|---|
| CA | 2157496 | 10/1994 |
| CA | 2158064 | 10/1994 |
| EP | 0 076 687 A1 | 4/1983 |
| EP | 0 275 416 | 7/1988 |
| EP | 0 558 312 A1 | 9/1993 |
| EP | 0 629 996 A2 | 12/1994 |
| EP | 0 629 996 A3 | 12/1994 |
| EP | 0 750 291 A1 | 12/1996 |
| EP | 0 948 237 A2 | 10/1999 |
| EP | 1 450 353 A1 | 8/2004 |
| EP | 1 450 354 A1 | 8/2004 |
| EP | 1 669 983 A1 | 6/2006 |
| JP | 06269084 A2 | 9/1994 |
| JP | 06319193 A | 11/1994 |
| WO | WO 0041169 A1 | 7/2000 |
| WO | WO 0156255 A1 | 8/2001 |
| WO | WO 0173761 A1 | 10/2001 |
| WO | WO 2006/130668 A2 | 12/2006 |

OTHER PUBLICATIONS

Avendano, C., Hermansky, H., 'Study on the Dereverberation of Speech Based on Temporal envelope Filtering, Proc. ICSLP '96, pp. 889-892, Oct. 1996.

Nakatani, T., Miyoshi, M., and Kinoshita, K., "Implementation and Effects of Single Channel Dereverberation Based on the Harmonic Structure of Speech," Proc. Of IWAENC-2003, pp. 91-94, Sep. 2003.

Fiori, S., Uncini, A., and Piazza, F., "Blind Deconvolution by Modified Bussgang Algorithm", Dept. of Electronics and Automatics—University of Ancona (Italy), ISCAS 1999.

Vieira, J., "Automatic Estimation of Reverberation Time," Audio EngineeringSociety, Convention Paper 6107, 116th Convention, May 8-11, 2004, Berlin, Germany, pp. 1-7.
Pornimitkul, Pradya Et Al., 2102797 Statistic Digital Signal Processing, Comparison of NLMS and RLS for Acoustic Echo Cancellation (AEC) and White Gaussian Noise (WGN), Department of Electrical Engineering Faculty of Engineering, 2002, pp. 1-19.
Bilcu, et al., "A New Variable Length LMS Algorithm: Theoretical Analysis and Implementations", 2002 IEEE, pp. 1031-1034.
Nascimento, Vitor H., "Improving the Initial Convergence of Adaptive Filters" Variable-Length LMS Algorithms, 2002 IEEE, pp. 667-670.
Ismo Kauppinen, "Methods for Detecting Impulsive Noise in Speech and Audio Signals", pp. 967-970, IEEE 2002.
Saeed V. Vaseghi and Peter J.W. Rayner, "The Effects of Non-Stationary Signal Characteristics on the Performance of Adaptive Audio Restoration System", pp. 377-380, IEEE 1989.
Anderson C.M., et al: "Adaptive Enhancement of Finite Bandwidth Signals in White Gaussian Noise", IEEE Trans. On Acoustics, Speech and Signal Processing, vol. ASSP-31, No. 1, Feb. 1983, pp. 17-28.
Chang J.H., et al: "Pitch Estimation of Speech Signal Based on Adaptive Lattice Notch Filter", Signal Processing, Elsevier Science Publishers B.V. Amsterdam, NL, vol. 85, No. 3, Mar. 2005, pp. 637-641.
Rabiner L.R., et al: "A Comparative Performance Study of Several Pitch Detection Algorithms", IEEE Trans. On Acoustics, Speech and Signal Processing, vol. ASSP-24, No. 5, Oct. 1976, pp. 399-418.
Byun K.J., et al: "Noise Whitening-Based Pitch Detection for Speech Highly Corrupted by Colored Noise", ETRI Journal, vol. 25, No. 1, Feb. 2003, pp. 49-51.
Campbell D.A., et al: "Dynamic Weight Leakage for LMS Adaptive Linear Predictors", Tencon '96 Proceedings, 1996 IEEE Tencon Digital Signal Processing Applications Perth, WA, Australia Nov. 26-29, 1996, NY, NY, USA, IEEE, US, vol. 2, Nov. 26, 1996, pp. 574-579.
Sasaoka N, et al: "A New Noise Reduction System Based on ALE and Noise Reconstruction Filter", Circuits and Systems, 2005. ISCAS 2005. IEEE International Symposium on KOBE, Japan May 23-26, 2005, Piscataway, NJ USA, IEEE May 23, 2005, pp. 272-275.
Kang, Hae-Dong; "Voice Enhancement Using a Single Input Adaptive Noise Elimination Technique Having a Recursive Time-Delay Estimator", Kyungbook National University (Korea), Doctoral Thesis, Dec. 31, 1993, pp. 11-26.
Anderson, C.M., et al: "Adaptive Enhancement of Finite Bandwidth Signals in White Gaussian Noise", IEEE Trans. On Acoustics, Speech and Signal Processing, vol. ASSP-31, No. 1, Feb. 1983, pp. 17-28.
Byun, K.J., et al: "Noise Whitening-Based Pitch Detection for Speech Highly Corrupted by Colored Noise", ETRI Journal, vol. 25, No. 1, Feb. 2003, pp. 49-51.
Campbell, D.A., et al: "Dynamic Weight Leakage for LMS Adaptive Linear Predictors", Tencon '96 Proceedings, 1996 IEEE Tencon Digital Signal Processing Applications Perth, WA, Australia Nov. 26-29, 1996, NY, NY, USA, IEEE, US, vol. 2, Nov. 26, 1996, pp. 574-579.
Chang, J.H., et al: "Pitch Estimation of Speech Signal Based on Adaptive Lattice Notch Filter", Signal Processing, Elsevier Science Publishers B.V. Amsterdam, NL, vol. 85, No. 3, Mar. 2005, pp. 637-641.
Learned, R.E. et al., A Wavelet Packet Approach to Transient Signal Classification, Applied and Computational Harmonic Analysis, Jul. 1995, pp. 265-278, vol. 2, No. 3, USA, XP 000972660. ISSN: 1063-5203. abstract.
Quatieri, T.F. et al., Noise Reduction Using a Soft-Decision Sine-Wave Vector Quantizer, International Conference on Acoustics, Speech & Signal Processing, Apr. 3, 1990, pp. 821-824, vol. Conf. 15, IEEE ICASSP, New York, US XP000146895, Abstract, Paragraph 3.1.
Quelavoine, R. et al., Transients Recognition in Underwater Acoustic with Multilayer Neural Networks, Engineering Benefits from Neural Networks, Proceedings of the International Conference EANN 1998, Gibraltar, Jun. 10-12, 1998 pp. 330-333, XP 000974500. 1998, Turku, Finland, Syst. Eng. Assoc., Finland. ISBN: 951-97868-0-5. abstract, p. 30 paragraph 1.
Rabiner, L.R., et al: "A Comparative Performance Study of Several Pitch Detection Algorithms", IEEE Trans. On Acoustics, Speech and Signal Processing, vol. ASSP-24, No. 5, Oct. 1976, pp. 399-418.
Sasaoka, N., et al: "A New Noise Reduction System Based on ALE and Noise Reconstruction Filter", Circuits and Systems, 2005. ISCAS 2005. IEEE International Symposium on KOBE, Japan May 23-26, 2005, Piscataway, NJ USA, IEEE May 23, 2005, pp. 272-275.
Simon, G., Detection of Harmonic Burst Signals, International Journal Circuit Theory and Applications, Jul. 1985, vol. 13, No. 3, pp. 195-201, UK, XP 000974305. ISSN: 0098-9886. abstract.
Zakarauskas, P., Detection and Localization of Nondeterministic Transients in Time series and Application to Ice-Cracking Sound, Digital Signal Processing, 1993, vol. 3, No. 1, pp. 36-45, Academic Press, Orlando, FL, USA, XP 000361270, ISSN: 1051-2004. entire document.
The prosecution history of U.S. Appl. No. 10/973,575 shown in the attached Patent Application Retrieval file wrapper document list, printed Dec. 30, 2008, including any substantive Office Actions and Applicant Responses.
The prosecution history of U.S. Appl. No. 11/101,796 shown in the attached Patent Application Retrieval file wrapper document list, printed Dec. 12, 2008, including any substantive Office Actions and Applicant Responses.
The prosecution history of U.S. Appl. No. 11/102,251 shown in the attached Patent Application Retrieval file wrapper document list, printed Dec. 12, 2008, including any substantive Office Actions and Applicant Responses.
The prosecution history of U.S. Appl. No. 11/298,052 shown in the attached Patent Application Retrieval file wrapper document list, printed Dec. 30, 2008, including any substantive Office Actions and Applicant Responses.
The prosecution history of U.S. Appl. No. 11/317,762 shown in the attached Patent Application Retrieval file wrapper document list, printed Jan. 2, 2009, including any substantive Office Actions and Applicant Responses.
The prosecution history of U.S. Appl. No. 11/849,009 shown in the attached Patent Application Retrieval file wrapper document list, printed Nov. 21, 2008, including any substantive Office Actions and Applicant Responses.
Koike, Shiin'ichi, "Adaptive Threshold Nonlinear Algorithm for Adaptive Filters with Robustness Against Impulse Noise," 1996, IEEE, NEC Corporation, Tokyo 108-01, pp. 1644-1647.
Tam, et al., "Highly Oversampled Subband Adaptive Filters for Noise Cancellation on a Low-resource DSP System," Proc. Of Int. Conf. On Spoken Language Processing (ICSLP), Sep. 2002, pp. 1-4.
Berk et al., "Data Analysis with Microsoft Excel", Duxbury Press, 1998, pp. 236-239 and 256-259.
Puder, H. et al., "Improved Noise Reduction for Hands-Free Car Phones Utilizing Information on a Vehicle and Engine Speeds", Sep. 4-8, 2000, pp. 1851-1854, vol. 3, XP009030255, 2000. Tampere, Finland, Tampere Univ. Technology, Finland Abstract.
Seely, S., "An Introduction to Engineering Systems", Pergamon Press Inc., 1972, pp. 7-10.
Shust, M. R., "Electronic Removal of Outdoor Microphone Wind Noise", obtained from the Internet on Oct. 5, 2006 at: <http://www.acoustics.org/press/136th/mshust.htm>, 6 pages.
Shust, M. R., Abstract of "Active Removal of Wind Noise From Outdoor Microphones Using Local Velocity Measurements", J. Acoust. Soc. Am., vol. 104, No. 3, Pt 2, 1998, 1 page.
Wahab A. et al., "Intelligent Dashboard With Speech Enhancement", Information, Communications, and Signal Processing, 1997. ICICS, Proceedings of 1997 International Conference on Singapore, Sep. 9-12, 1997, New York, NY, USA, IEEE, pp. 993-997.
Widrow, B. et al., "Adaptive Noise Cancelling: Principles and Applications" 1975, IEEE, vol. 63, No. 13, New York, pp. 1692-1716.

* cited by examiner

SUB-BAND PERIODIC SIGNAL ENHANCEMENT SYSTEM

PRIORITY CLAIM

This application is a continuation-in-part of and claims the benefit of priority from U.S. application Ser. No. 10/973,575, filed Oct. 26, 2004, which is incorporated by reference.

BACKGROUND OF THE INVENTION

1. Technical Field

This disclosure relates to signal processing systems. In particular, this disclosure relates to a system that enhances periodic signal components.

2. Related Art

Audio signal processing systems may capture sound, reproduce sound, and convey sound. Audio systems may be susceptible to noise that can corrupt, mask, or otherwise detrimentally affect signal content. Wind, rain, background noise, such as engine noise, electromagnetic interference, and other noise sources may contribute noise to a signal captured, reproduced, or conveyed to other systems. When the noise level of sound increases, intelligibility of the signal may decrease.

Some systems may attempt to minimize noise by detecting sound through multiple microphones. The signals from each microphone may be combined to limit the noise. In some applications, multiple microphones may not be available. Other systems may use noise filters to selectively attenuate sound. The noise filters may indiscriminately eliminate or minimize desired signal content. Therefore, there is a need for a system that enhances signals.

SUMMARY

A signal enhancement system reinforces signal content and improves the signal-to-noise ratio of a signal. The system detects, tracks, and reinforces non-stationary periodic signal components of a signal. The periodic signal components may represent vowel sounds or other voiced sounds. The system may detect, track, and attenuate quasi-stationary signal components in the signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like-referenced numerals designate corresponding parts throughout the different views.

DETAILED DESCRIPTION OF THE PREFERRED EMBODIMENTS

The signal enhancement system detects and tracks one or more fundamental frequency components in a signal. The system may reinforce the tracked frequency components. The system may improve the intelligibility of information in a speech signal or other audio signals. The reinforced signal may have an improved signal-to-noise ratio (SNR).

Figure 1:
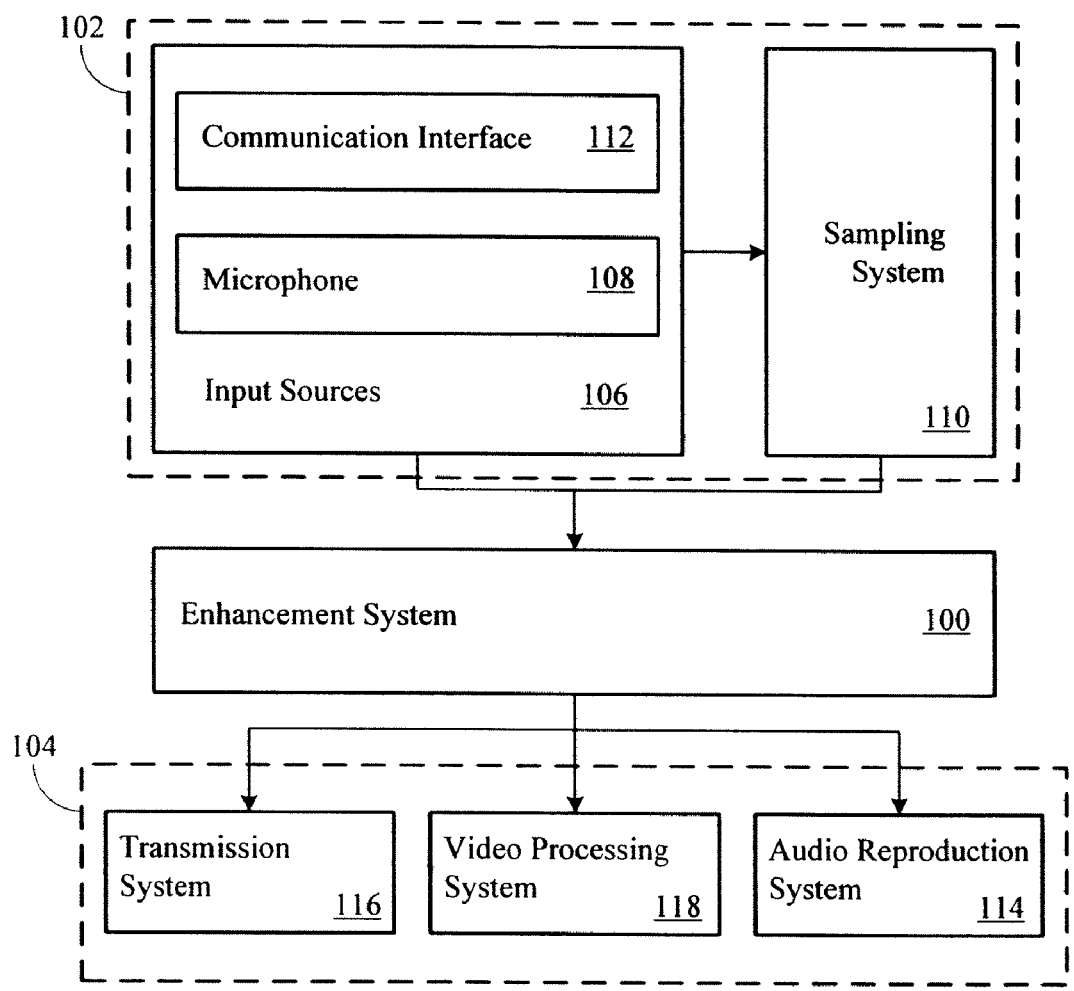
FIG. 1 is a signal enhancement system with preprocessing and post-processing logic.

In FIG. 1, a signal enhancement system 100 operates in conjunction with preprocessing logic 102 and post-processing logic 104. The enhancement system 100 may be implemented in hardware and/or software. The enhancement system 100 may include a digital signal processor (DSP). The DSP may execute instructions that delay an input signal, track frequency components of a signal, filter a signal and/or reinforce spectral content in a signal. Alternatively, the enhancement system 100 may include discrete logic or circuitry, a mix of discrete logic and a processor, or may be distributed over multiple processors or programs.

The enhancement system 100 may accept input from the input sources 106. The input sources 106 may include digital signal sources or analog signal sources, such as a microphone 108. The microphone 108 may be connected to the enhancement system 100 through a sampling system 110. The sampling system 110 may convert analog signals from the microphone 108 into digital form at a selected sampling rate.

The sampling rate may be selected to capture any desired frequency content. For speech, the sampling rate may be approximately 8 kHz to about 22 kHz. For music, the sampling rate may be approximately 22 Hz to about 44 kHz. Other sampling rates may be used for speech and/or music.

The digital signal sources may include a communication interface 112, other circuitry or logic in the system in which the enhancement system 100 is implemented, or other signal sources. When the input source is a digital signal source, the signal enhancement system 100 may accept the digital signal samples with or without additional preprocessing.

The signal enhancement system 100 may also connect to post-processing logic 104. The post-processing logic 104 may include an audio reproduction system 114, digital and/or analog data transmission systems 116, or video processing logic 118. Other post-processing logic also may be used.

The audio reproduction system 114 may include digital to analog converters, filters, amplifiers, and other circuitry or logic. The audio reproduction system 114 may be a speech and/or music reproduction system. The audio reproduction system 114 may be implemented in a cellular telephone, wireless telephone, digital media player/recorder, radio, stereo, portable gaming device, or other devices employing sound reproduction.

The video processing system 118 may include circuitry and/or logic that provides a visual output. The signal used to prepare the visual output may be enhanced by the processing performed by the enhancement system 100. The video processing system 118 may control a television or other entertainment device. Alternatively, the video processing system 118 may control a computer monitor or liquid crystal display (LCD).

The transmission system 116 may provide a network connection, digital or analog transmitter, or other transmission circuitry and/or logic. The transmission system 116 may communicate enhanced signals generated by the enhancement system 100 to other devices. In a car phone, for example, the transmission system 116 may communicate enhanced signals from the car phone to a base station or other receiver through a wireless connection such as a ZigBee, Mobile-Fi, Ultrawideband, Wi-fi, or a WiMax protocol.

Figure 2:
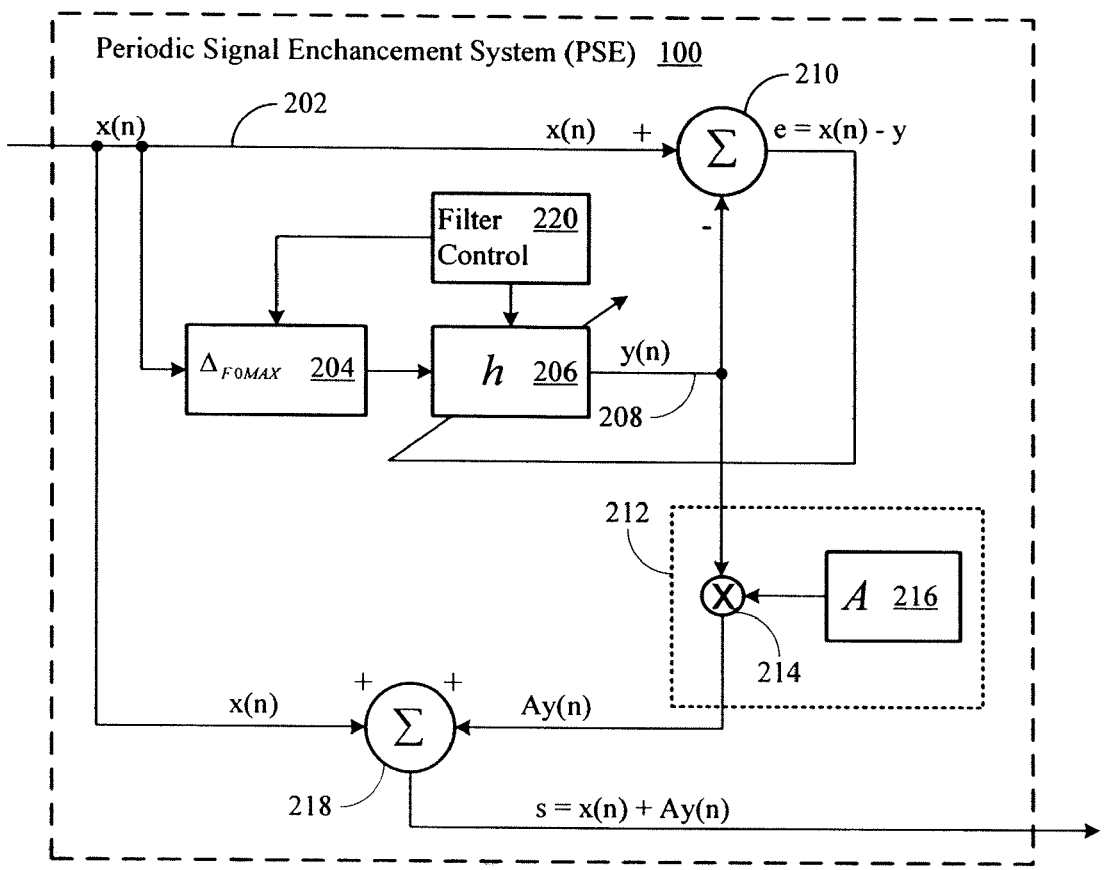
FIG. 2 is a single stage signal enhancement system.

FIG. 2 is an enhancement system 100, also referred to as a periodic enhancement system. The enhancement system 100 may include a signal input 202 labeled as x(n) or x, where the index n may represent the sample number. The input signal x(n) may be time domain samples of speech. However, the enhancement system 100 may enhance signals with a different frequency range, whether audible or inaudible.

The enhancement system 100 may process quasi-stationary or non-stationary signals. Non-stationary signals may vary in frequency and/or amplitude relatively quickly over time. Voice is one example of a non-stationary signal.

With few exceptions, even the fundamental frequency component in a speaker's voice changes during speech. The change in fundamental frequency may vary by as much as approximately 50 percent per 100 ms or more. To the human ear, however, the speaker's voice may have a relatively constant pitch.

Quasi-stationary signals may change in frequency and/or amplitude less frequently than non-stationary signals. Quasi-stationary signals may arise from machine noise, a controlled human voice, or from other sources. Slowly changing engine noise or alternator whine are examples of quasi-stationary signals.

In FIG. 2, the input signal is coupled to delay logic 204. The delay logic 204 may impart a delay to the input signal. The delay may vary depending on the particular implementation of the enhancement system 100. The delay may correspond to a period of a selected maximum pitch. The maximum pitch may be equal to the greatest pitch in the input signal that the enhancement system 100 enhances. The maximum pitch may vary widely depending on the type and characteristics of the input signal.

Speech signals may include a fundamental frequency component from approximately 70 Hz to about 400 Hz. Male speech may include a fundamental frequency component between approximately 70 Hz to about 200 Hz. Female speech may include a fundamental frequency component between approximately 200 Hz to about 400 Hz. A child's speech may include a fundamental frequency component between approximately 250 Hz to about 400 Hz.

The enhancement system 100 may process input signals that include speech from both male and female voices, either separately or simultaneously and overlapping. In such systems, the maximum pitch period may approximately correspond to the period of the fundamental frequency of the female voice. The maximum pitch period may be approximately about 1/300 Hz (approximately 3.3 ms), or it may be another pitch period associated with female voice.

Alternatively, the enhancement system 100 may process male speech. In such implementations, the maximum pitch period may correspond to the period of the fundamental frequency of a male voice. The maximum pitch period may be approximately 1/150 Hz (approximately 6.6 ms), or may be another pitch period.

The delay logic 204 may delay the input signal by the number of signal samples corresponding to the maximum pitch period. The number of signal samples may be given by:

$$NSS = MPP * f_s$$

where NSS is the number of signal samples, MPP is the maximum pitch period and $f_s$ is the sampling rate. Assuming an MPP of about 3.3 ms and a sampling rate of about 8 kHz, NSS=approximately 27 samples. In FIG. 2, NSS corresponds to $\Delta_{F0MAX}$.

The delayed input signal may be received by the filter 206. The filter 206 may include a filter output 208 that carries a filtered output signal, labeled y(n) or y. The filter 206 may track one or more frequency components in the input signal based on the delayed input signal. The filter 206 may track the fundamental frequencies in the input signal as the pitch changes during voiced speech.

The filter 206 may reproduce, replicate, approximate or otherwise include the tracked frequency content in the filtered output signal. The filter 206 may be a finite impulse response filter (FIR) or other type of digital filter. The filter coefficients may be adaptive. The filter 206 may be adapted by a normalized least mean squares (NLMS) technique or other type of adaptive filtering technique, such as recursive least squares (RLS) or proportional LMS. Other tracking logic, including other filters may also be used.

The filter 206 may converge to the fundamental frequency in the input signal. The range of fundamental frequencies $f_0$ over which the filter 206 converges may be given by the following equations:

$$f_o = f_{0MAX} - f_{0MIN}$$

$$f_{0MAX} = \frac{f_s}{\Delta_{F0MAX}}$$

$$f_{0MIN} = \frac{f_s}{\Delta_{F0MAX} + L}$$

where $\Delta_{F0MAX}$ is the period for the maximum pitch (expressed in terms of samples), $f_s$ is the sampling frequency (in units of Hz), and L is the length of the filter 206 (in units of samples). The filter length L may increase or decrease to increase or decrease the frequency extent over which the filter 206 tracks frequency components.

In the example above, the maximum pitch was approximately 300 Hz and the delay logic 204 may use a 27 sample delay. A filter length L of 64 samples may yield a filter 206 that tracks fundamental frequency content over a frequency range of approximately 88 Hz to about 296 Hz as follows:

$$f_{0MAX} = \frac{8000}{27} \approx 296$$

$$f_{0MIN} = \frac{8000}{27 + 64} \approx 88$$

$$f_o \approx 296 - 88 = 208 \text{ Hz}$$

The filter 206 may adapt over time. The filter 206 may adapt by evaluating an error signal "e" on a sample-by-sample basis. Alternatively, the filter 206 may adapt based on blocks of samples, or some other basis. In adapting, the filter 206 may change one or more of its filter coefficients. The filter coefficients may change the response of the filter 206. The filter coefficients may adapt the filter 206 so that the filter 206 may minimize the error signal e.

The error estimator 210 may generate the error signal e. The error estimator 210 may be an adder, comparator, or other circuitry or logic. The error estimator 210 may compare the input signal "x" with the filtered output signal "y".

As the filter 206 converges to the fundamental frequency in the input signal, the error signal may decrease. As the error signal decreases, the filtered output signal "y" may more closely resemble the input signal x delayed by an integer multiple of the signal's fundamental frequencies. The gain control logic 212 may respond to the error signal.

The optional gain control logic 212 may include a multiplier 214 and a gain parameter 216. The gain control logic 212 may attenuate, amplify, or otherwise modify the filtered output signal. FIG. 2 shows that the gain control logic 212 may apply a gain "A" to the filtered output signal to produce the gain controlled signal "Ay".

The reinforcement logic 218 may reinforce frequency content in the input signal "x" with the gain controlled signal Ay. The reinforcement logic 218 may be an adder or other circuitry and/or logic. The reinforcement logic 218 may produce the enhanced output signal according to the equation below:

$$s = x + Ay$$

When the error signal e increases, the gain control logic 212 may reduce the gain A. When the gain is reduced, the filtered output signal may contribute less to the enhanced output signal. The relationship between the error signal e and the gain A may be continuous, stepped, linear, or non-linear.

In one implementation, the enhancement system 100 may establish one or more error thresholds. As the error signal exceeds an upper threshold, the gain control logic 212 may reduce the gain A to about zero. The upper threshold may be set to the input signal so that if e>x, then the gain A may be set to about zero. As the error signal falls below a lower threshold, the gain control logic 212 may increase the gain A to a value of about one.

When the error signal e exceeds the upper threshold, the filter control logic 220 may reset the filter 206. When the filter 206 is reset, the control logic 220 may reset the filter coefficients to about a value of zero, may re-initialize the filter coefficients, or may take other actions. The control logic 220 may also dynamically modify the filter length, may modify the delay implemented by the delay logic 204, or may modify other characteristics of the enhancement system 100. The control logic 220 also may modify the enhancement system 100 to adapt to changing environments in which the enhancement system 100 is used, to adapt the enhancement system 100 to a new speaker, or to other applications.

The filter control logic 220 also may control how quickly the filter 206 adapts, whether the filter adapts, or may monitor or control other filter characteristics. The control logic 220 may expect quickly changing frequency and amplitude components in the input signal. The control logic 220 may also expect or determine over time that particular frequency components in the input signal are prevalent.

The control logic 220 also may determine that the input signal x has changed in frequency content, amplitude, or other characteristics from what is expected or from what has been determined. In response, the control logic 220 may stop the filter 206 from adapting to the new signal content, may slow the rate of adaptation, or may take other actions. The control logic 220 may exercise control over the filter 206 until the input signal characteristics return to an expected signal, until a predetermined time has elapsed, until instructed to release control, or until another time or condition is met.

The delay logic 204 may prevent the filtered output signal from precisely duplicating the current input signal x. Thus, the filtered output signal may closely track the selected periodicities in the input signal x. When the current input signal x is reinforced by the filtered output signal y to produce the output signal s, periodic signal components may combine constructively, and random noise components may combine destructively. Therefore, the periodic signal components may be enhanced more than the noise.

The delay introduced by the delay logic 204 and the filter 206 may be approximately one cycle of a fundamental frequency component tracked by the filter 206. The delay may correspond to the glottal pulse delay for voice sounds, such as vowels. When the filtered output signal is added to the input signal, the delay may allow the fundamental frequency components to add in-phase or approximately in-phase.

When added in-phase, the resulting gain in the fundamental frequency content in the enhanced output signal may be approximately 6 dB or more. The noise in the input signal and the filtered output signal may tend to be out of phase. When the input signal and the filtered output signal are added, the noise may increase less than the enhanced frequency content, for example by 3 dB or less. The enhanced output signal may have an increased signal-to-noise ratio.

The input signal x that the enhancement system 100 processes may include multiple fundamental frequencies. For example, when two speakers are speaking at the same time, input signal may include two non-stationary fundamental frequencies. When multiple fundamental frequencies are present, the filter 206 may continue to adapt and converge to provide a filtered out signal y, which may be a delayed version of the input signal. The reinforcement logic 218 may reinforce one or more of the fundamental frequencies present in the input signal.

Figure 3:
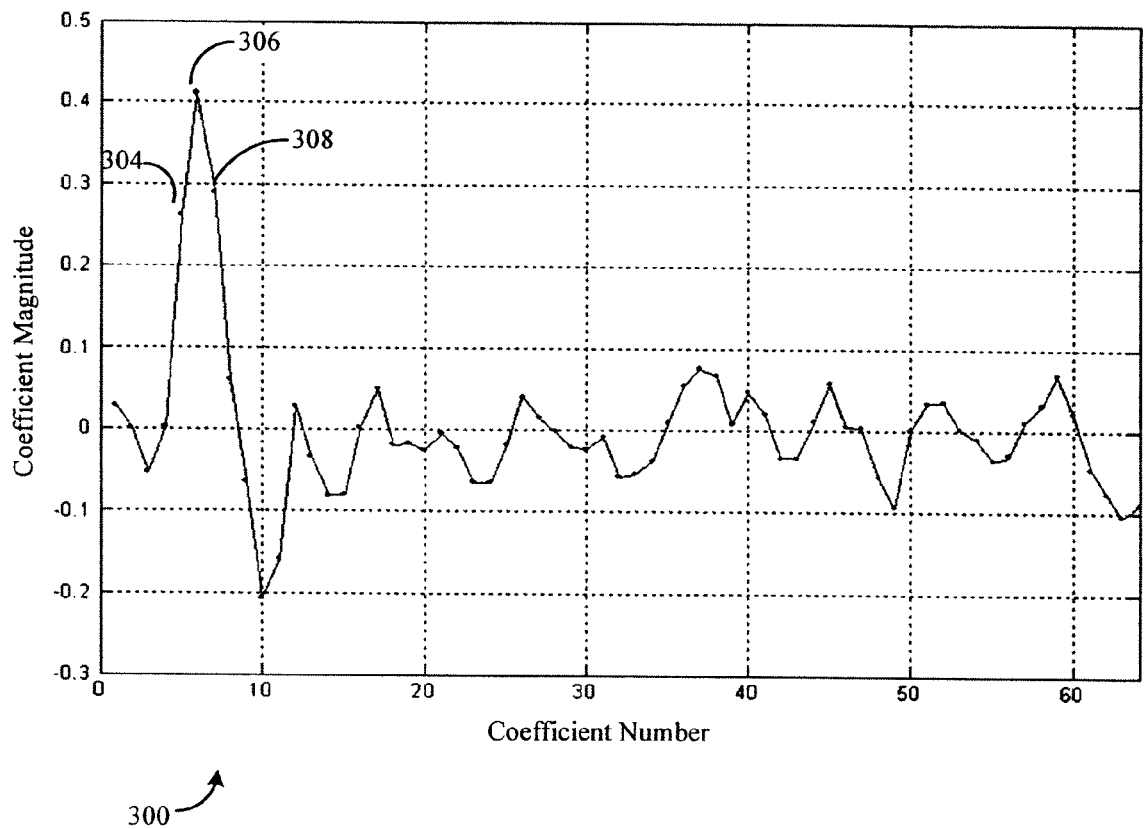
FIG. 3 is a plot of filter coefficients in a filter adapted to a female voice.

FIG. 3 is a plot that illustrates coefficients 300 for the filter 206. The coefficients are plotted by coefficient number on the horizontal axis and by magnitude on the vertical axis. The coefficients 300 may show that the filter 206 has adapted to female speech.

At any instance in time, the coefficients 300 may be analyzed to determine a fast estimate of the fundamental frequencies in the input signal, with good temporal resolution. The coefficients 300 may begin to peak at about coefficient 304 (the fifth filter coefficient), coefficient 306 (the sixth filter coefficient), and coefficient 308 (the seventh filter coefficient). By searching for a coefficient peak or an approximate coefficient peak and determining a corresponding coefficient index, c, a fast approximation of the fundamental frequency, $f_a$, may be made where:

$$f_a = \frac{f_s}{(c + \Delta_{F0MAX})}$$

In FIG. 3, the coefficient peak is at the sixth filter coefficient 306. Assuming an 8 kHz sampling rate and a 27 sample delay:

$$f_a = \frac{f_s}{(c + \Delta_{F0MAX})} = \frac{8000}{6 + 27} \approx 242 \text{ Hz}$$

Figure 4:
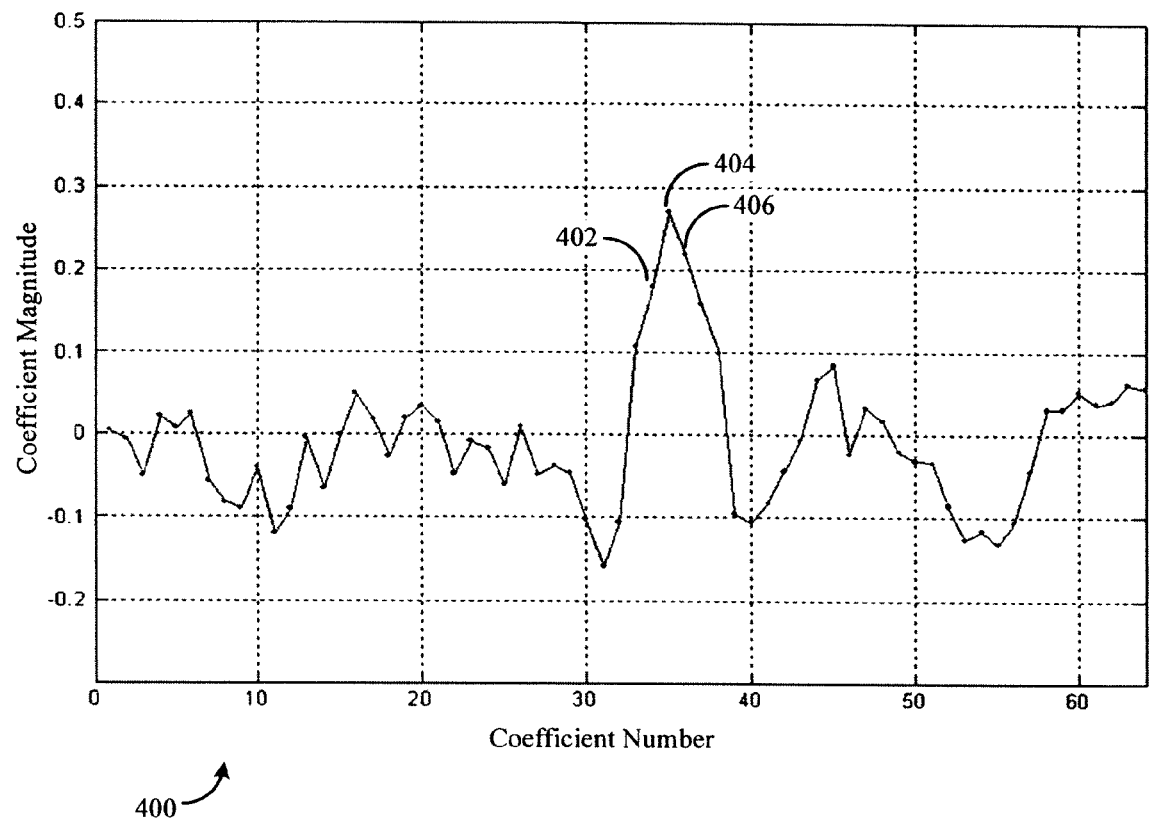
FIG. 4 is a plot of filter coefficients in a filter adapted to a male voice.

FIG. 4 is a plot showing coefficients 400 for the filter 206 that may have adapted to male speech. The coefficient peak appears near coefficient 402 (the 34th filter coefficient), coefficient 404 (the 35th filter coefficient), and coefficient 406 (the 36th filter coefficient). An approximation to the fundamental frequency is:

$$f_a = \frac{f_s}{(c + \Delta_{F0MAX})} = \frac{8000}{35 + 27} \approx 129 \text{ Hz}$$

The control logic 220 may store historical data on many characteristics of the input signal, including the fundamental frequency of the input signal as it changes over time. The control logic 220 may examine the historical data as an aid in determining whether the characteristics of the input signal have unexpectedly changed. The control logic 220 may respond by exercising adaptation control over the filter 206 or by taking other actions.

Figure 5:
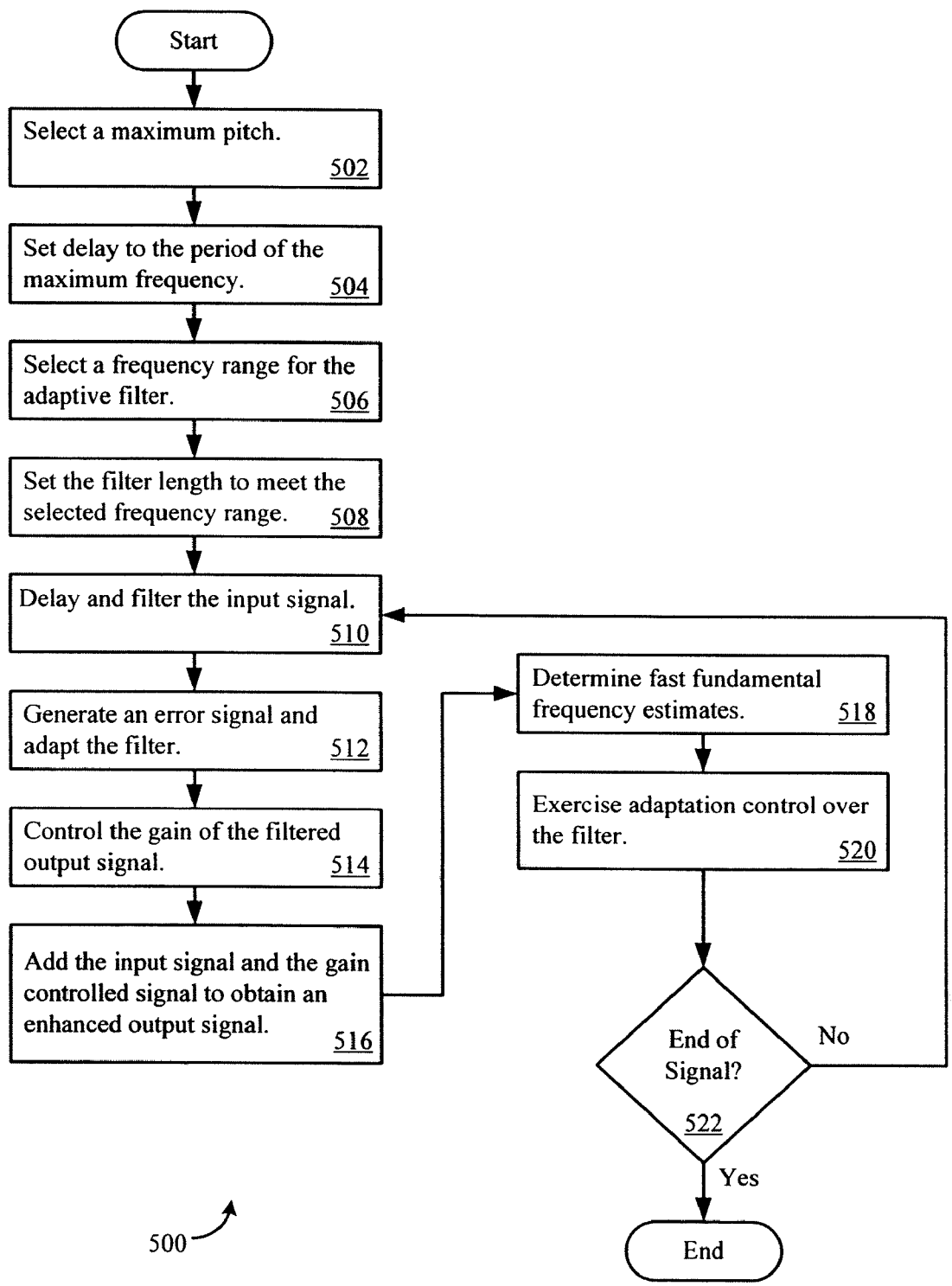
FIG. 5 is a flow diagram of signal enhancement.

FIG. 5 is flow diagram showing acts that may be taken to enhance a periodic signal. A maximum pitch may be selected for processing by the enhancement system 100 (Act 502). The delay logic 204 may be set to implement the period of the maximum pitch (Act 504). A frequency range over which the enhancement system 100 will operate may also be selected (Act 506). The filter length of the filter 205 may be set to accommodate the frequency range (Act 508). The filter length may be dynamically changed during filter 206 operation.

The input signal may be delayed and filtered (Act 510). The enhancement system 100 may generate an error signal and may responsively adapt the filter 206 (Act 512). The enhancement system 100 may control the gain of the filtered output signal (Act 514). The enhancement system 100 may add the input signal and the gain controlled signal (Act 516) to produce an enhanced output signal. The enhancement system 100 also may determine fundamental frequency estimates (Act 518). The enhancement system 100 may employ the frequency estimates to exercise adaptation control over the filter 206 (Act 520).

Figure 6:
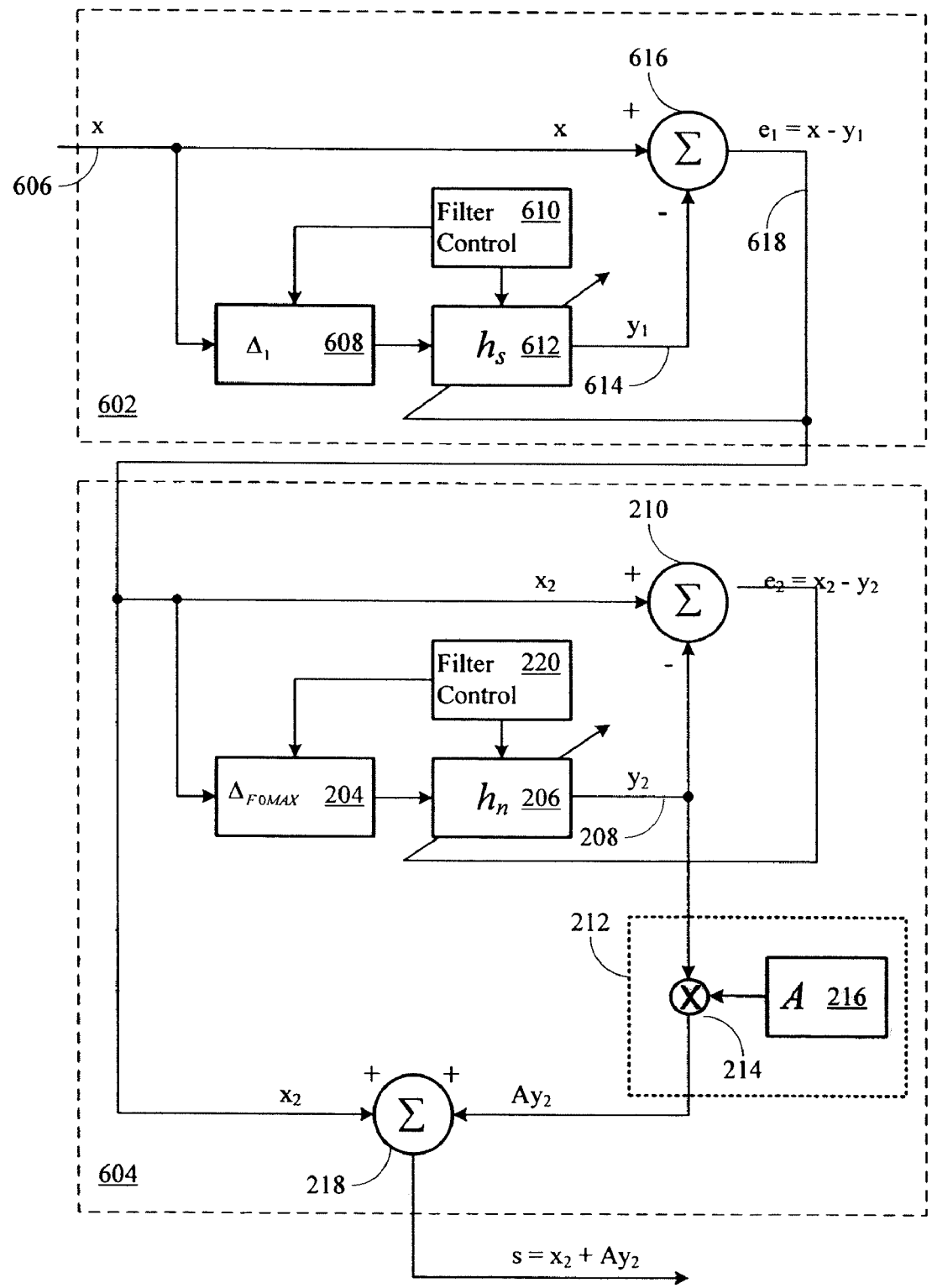
FIG. 6 is a multiple stage signal enhancement system.

FIG. 6 shows a multiple stage enhancement system 600. The enhancement system 600 may include a first filter stage 602 and a second filter stage 604. The filter stages 602 and 604 may respond or adapt at different rates. The first filter stage 602 may adapt slowly and may suppress quasi-stationary signal components. The quasi-stationary signal components may be present in the input signal because of relatively consistent background noise, such as engine noise or environmental effects, or for other reasons.

A signal input 606 may connect to the first stage 602. The signal input 606 may connect to the delay logic 608. The delay logic may implement a delay that corresponds to the period of a maximum quasi-stationary frequency that may be suppressed by the first stage 602.

The maximum quasi-stationary frequency may be selected according to known or expected characteristics of the environment in which the enhancement system 600 is used. The filter control logic 610 may dynamically modify the delay to adapt the first stage 602 to the environment. The filter control logic 610 also may control the quasi-stationary filter 612.

The filter 612 in the first stage may include signal component tracking logic such as a NLMS adapted FIR filter or RLS adapted FIR filter. The filter 612 in the first stage may adapt slowly, for example with a sampling rate of about 8 kHz, a filter length of about 64, and an NLMS step size larger than about 0 and less than approximately 0.01. This may allow attenuation of quasi-stationary periodic signals while minimally degrading typical speech signals. The first stage filtered output 614 may provide a filtered output signal that approximately reproduces the quasi-stationary signal component in the input signal.

The suppression logic 616 and slow filter adaptation may allow non-stationary signal components to pass through the first stage 602 to the second stage 604. On the other hand, the suppression logic 616 may suppress quasi-stationary signal components in the input signal. The suppression logic 616 may be implemented as arithmetic logic that subtracts the filtered output signal from the input signal.

The replicated quasi-stationary signal content in the filtered output signal may be removed from the input signal. The output signal produced by the first stage 602 may be shown by the equation below:

$$x_2 = e_1 = x - y_1$$

where $e_1$ is the first stage output signal, x is the input signal, and $y_1$ is the first stage filtered output. The first stage output 618 may be connected to the second stage 604. The second stage 604 may process the signal $x_2$ with the adaptive filter 206. The filter 206 may adapt quickly, for example with a sampling rate of 8 about kHz, a filter length of about 64, and an NLMS step size larger than approximately 0.6 and less than about 1.0. This may allow the adaptive filter 206 to track the fundamental frequencies in typical speech signals.

The second stage 604 may enhance non-stationary signal components in the first stage output signal. The non-stationary signal components may be present in the input signal as a result of speech, music, or other signal sources. The second stage 604 may process the first stage output signal as described above.

The enhancement system 600 may employ a first suppression stage 602 followed by a second enhancement stage 604. The enhancement system 600 may be employed to reinforce non-stationary signal content, such as voice content. In environments that introduce slowly changing signal components, the enhancement system 600 may remove or suppress the slowly changing signal components. In a car phone, for example, the first stage 602 may remove or suppress engine noise, road noise, or other noises, while the second stage 604 enhances non-stationary signal components, such as male or female voice components.

The signal enhancement system 100 may enhance periodic signal content, increase SNR, and/or decrease noise in an input signal. When applied to a voice signal, the enhancement system 100 may reinforce fundamental speech frequencies and may strengthen vowel or other sounds. The enhancement system 100 may enhance other signals, whether they are audible or inaudible.

The overall delay introduced by the delay logic 204 or 608 and the filter 206 or 612 also may be approximately an integer number (one or greater) of cycles of the tracked pitch period. Delaying by additional cycles may allow the input signal to change to a greater degree than by waiting one cycle. Adding the longer delayed filtered signal to the current input signal may produce special effects in the output signal, such as reverberation, while still enhancing fundamental frequency components.

Figure 7:
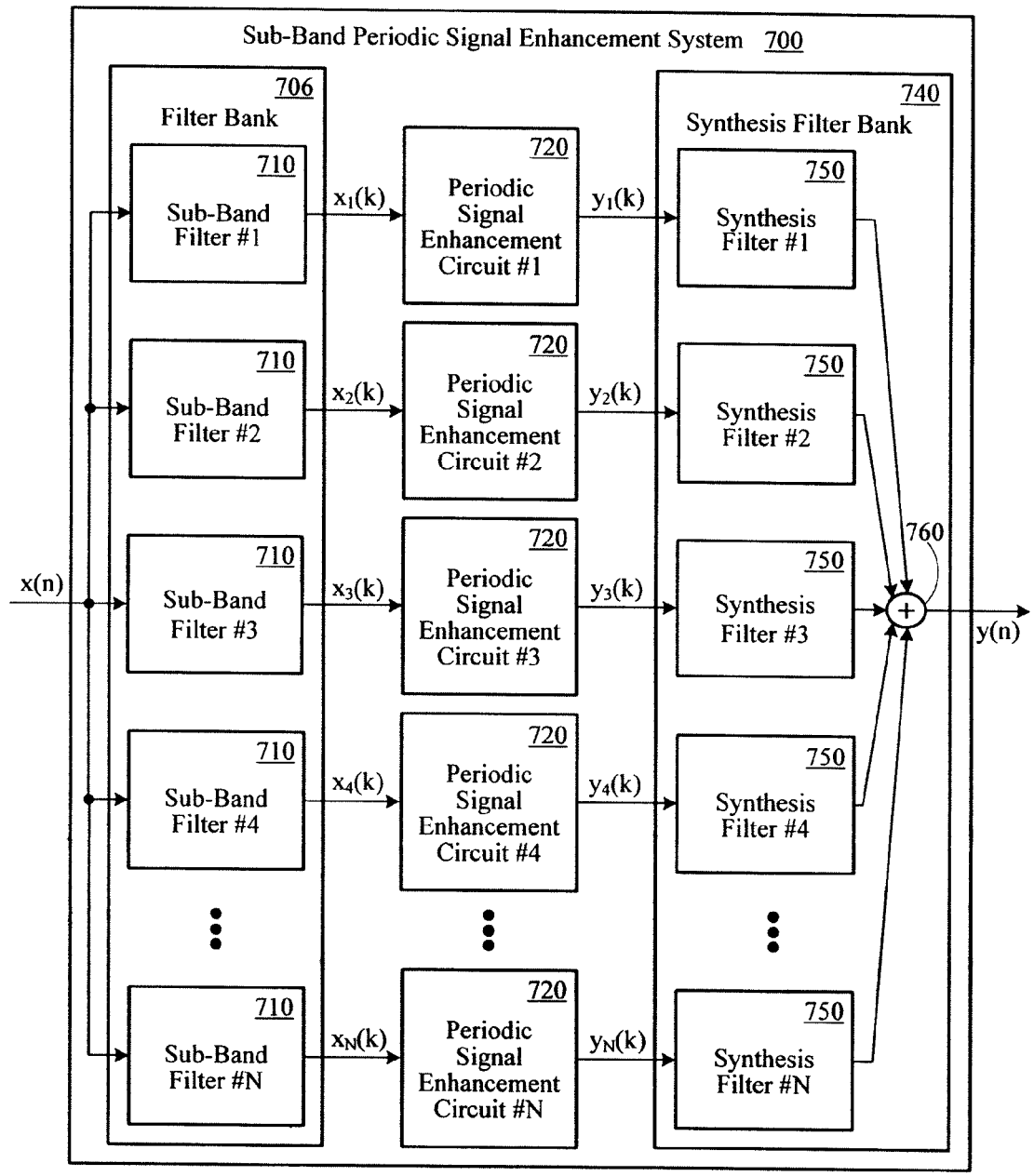
FIG. 7 is a sub-band signal enhancement system.

Performance of the periodic enhancement system 100 of FIG. 2 may be improved by dividing the frequency range of interest into a plurality of sub-bands. FIG. 7 shows a sub-band periodic signal enhancement system 700. The input signal is labeled x(n) and may represent time domain samples of speech. The sub-band periodic enhancement system 700 may enhance signals of any frequency range, whether audible or inaudible.

The sub-band periodic signal enhancement system 700 may include a filter bank 706 having a plurality of band-pass filters 710. The filter bank 706 may divide the input signal spectrum into a plurality of sub-band frequencies. Processing each sub-band frequency range individually may provide greater control and flexibility when processing the input signal x(n). Because each band-pass filter 710 may process a specific frequency range, the amount of signal enhancement in each sub-band may be more accurately controlled. When the signal-to-noise ratio across the frequency spectrum is non-uniform, the sub-band periodic signal enhancement system 700 may permit more accurate control of the amount of signal enhancement in each sub-band. This may permit harmonic signals to be enhanced more evenly across the entire spectrum of interest.

Important harmonic frequencies may be present in lower-frequency regions of a speech signal. Dividing the frequency range into sub-bands and processing each sub-band separately may permit improved isolation of individual harmonic components. This may increase the signal-to-noise ratio of the output signal. Dividing the frequency range into sub-bands may also permit improved isolation of weak harmonic signals in the presence of stronger harmonic signals or out-of-band noise signals.

Each band-pass filter 710 may provide band-divided output signals $x_1(k) \ldots x_N(k)$ to respective periodic signal enhancement circuits 720. The subscript N may denote the number of sub-bands. Each periodic signal enhancement circuit 720 may be the same as or similar to the periodic signal enhancement system 100 of FIG. 2. Each periodic signal enhancement circuit 720 may generate sub-band output signals $y_1(k) \ldots y_N(k)$.

Each band-pass filter 710 may be similar to or identical in construction to the other band-pass filters in the filter bank 706. Alternatively, any specific band-pass filter may be different than an adjacent or other filter and may differ with regard to frequency response, bandwidth, band-pass range, or other parameters. For example, if the range of input frequencies varies from about 0 Hz to about 5,000 Hz, ten band-pass filters 710 may be used. The first band-pass filter may divide the input frequency into signals in the range from about 0 Hz to about 500 Hz, the second band-pass filter may divide the input frequency into signals in the range from about 500 Hz to 1000 Hz, etc. However, the frequency range processed may be greater or less than 5,000 Hz, and the number of band-pass filters may change. The choice of the number of band-pass filters 710 may be based on economic and complexity criteria. For clarity, five band-pass filters 710 are shown, but a greater number of filters or a fewer number of filters may be used.

The band-pass filter bank 706 may satisfy the perfect reconstruction principle. The perfect reconstruction principle stipulates that an original signal may be fully recovered from a plurality of corresponding sub-band signals by using an appropriate synthesis filter bank. Each band-pass filter 710 may be a finite impulse response (FIR) filter and may be implemented as an FFT (fast Fourier transform) filter. For example, each sub-band filter 710 may have about five to about ten taps and a similar number of filter coefficients.

The sub-band filter bank 706 may have a non-uniform bandwidth depending upon the specific application and type of input signal processed. The sub-band filter bank 706 may include Gammatone-type band-pass filters. Gammatone-type filters may model the human auditory system where the bandwidth and frequency response of each band-pass filter may approximate a basilar membrane.

Each band-pass filter 706 may be implemented as a separate hardware or software component in the sub-band periodic signal enhancement system 700. The computational complexity of the sub-band periodic enhancement system 700 may depend upon the number of sub-bands. To reduce cost and complexity, the number of separate band-pass filters 706 may be reduced by down-sampling the input signal. Down-sampling by a selected factor may require a corresponding increase in the sampling rate. The more complex the frequency response of each sub-band adaptive filter, the greater the length of the adaptive filter needed. For a filter bank 706 having N sub-bands, the input signal may be down-sampled by a factor of N. As a result, the length of each adaptive filter may be 1/N of the length of an equivalent adaptive filter without employing down-sampling. Accordingly, the computational load may not be significantly increased by using a plurality of sub-bands.

A synthesis filter bank 740 having a plurality of sub-band synthesis filters 750 may receive the respective output signals $y_1(k) \ldots y_N(k)$. The synthesis filter bank may reconstruct the sub-band signals and may include a summing circuit 760 to combine the sub-band signals and generate an output signal y(n). The synthesis filter bank 750 may also satisfy the perfect reconstruction principle. Each sub-band synthesis filter 750 may be similar to or identical to the other sub-band synthesis filters in the synthesis filter bank 740. Alternatively, any specific sub-band synthesis filter may be different than an adjacent or other filter and may differ with regard to frequency response, bandwidth or other parameters. Each sub-band synthesis filter 750 may be a finite impulse response (FIR) filter and may be implemented as an inverse FFT (fast Fourier transform) filter. For example, each sub-band synthesis filter 750 may have about five to about ten taps and a similar number of filter coefficients.

Figure 8:
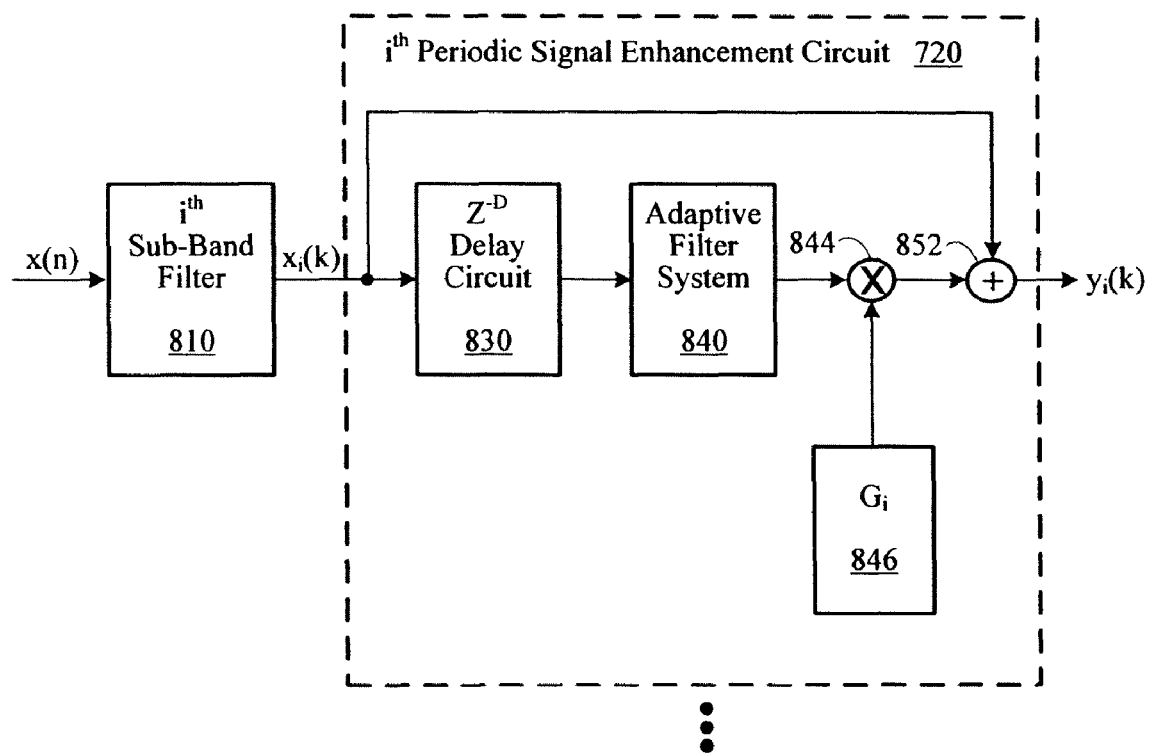
FIG. 8 is a sub-band signal enhancement circuit having selectable enhancement control.

FIG. 8 shows components of an exemplary sub-band range for a periodic sub-band enhancement circuit 720. The illustrated sub-band enhancement circuit 720 may represent, for example, the $i^{th}$ sub-band where i may range from 1 to N. The periodic sub-band enhancement circuit 720 may receive a sub-band signal $x_i(k)$ from a band-pass filter 810. The band-pass filter 810 may be similar to or identical to the band-pass filters 710 of FIG. 7 and may represent the $i^{th}$ arbitrarily illustrated sub-band frequency range. The periodic signal enhancement circuit 720 may be used in place of the periodic signal enhancement circuit 720 in FIG. 7. The periodic signal enhancement circuit 720 may provide a sub-band output signal $y_i(k)$ received by the corresponding sub-band synthesis filter 750 of FIG. 7.

The periodic signal enhancement circuit 720 may include a delay circuit 830 that receives the sub-band signal $x_i(k)$ and an adaptive filter system 840. The adaptive filter system 840 may include the adaptive filter 206, the filter control logic 220, the error estimator 210, the gain control logic 212 and the reinforcement logic 218. A multiplier circuit 844 may scale the output of the adaptive filter system 840 by a control parameter $G_i$ (846). The control parameter $G_i$ may control an amount of periodic signal enhancement in each sub-band. The value of $G_i$ may vary from about 0 to about 1. The amount of periodic signal enhancement in each sub-band may be adjusted depending upon the background noise spectrum, microphone characteristics, and channel impulse response. A summing circuit 852 may sum or combine the scaled output of the multiplier circuit 844 and the output x(k) of the band-pass filter.

Figure 9:
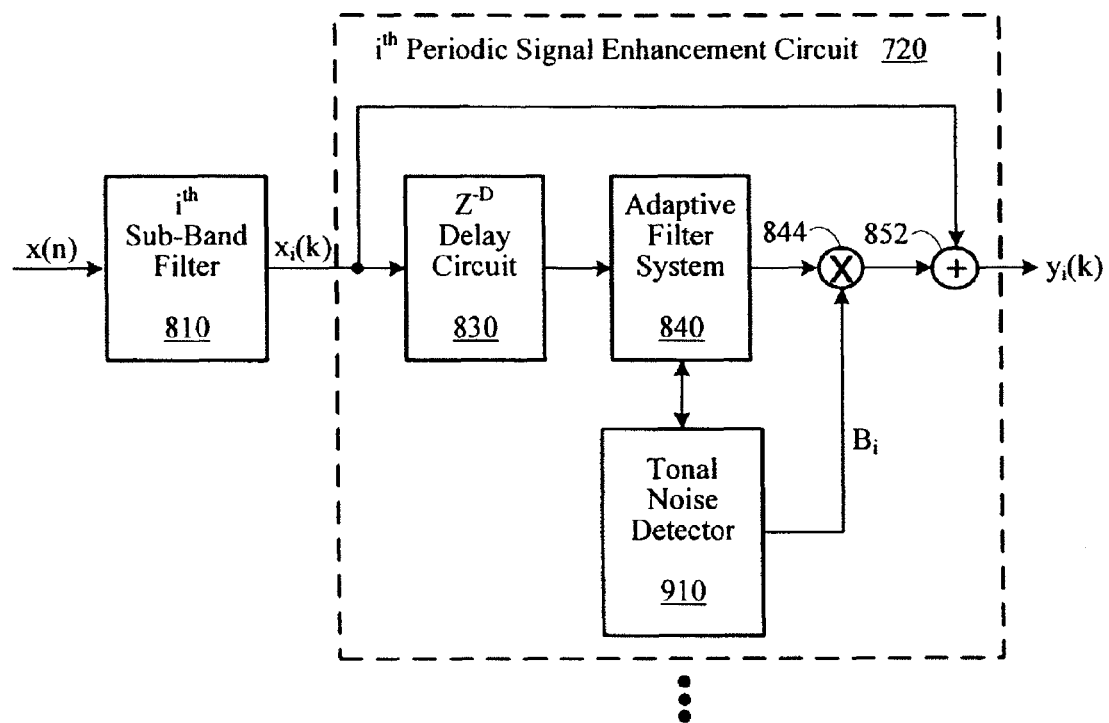
FIG. 9 is a sub-band signal enhancement circuit having a tonal noise detector.
Figure 10:
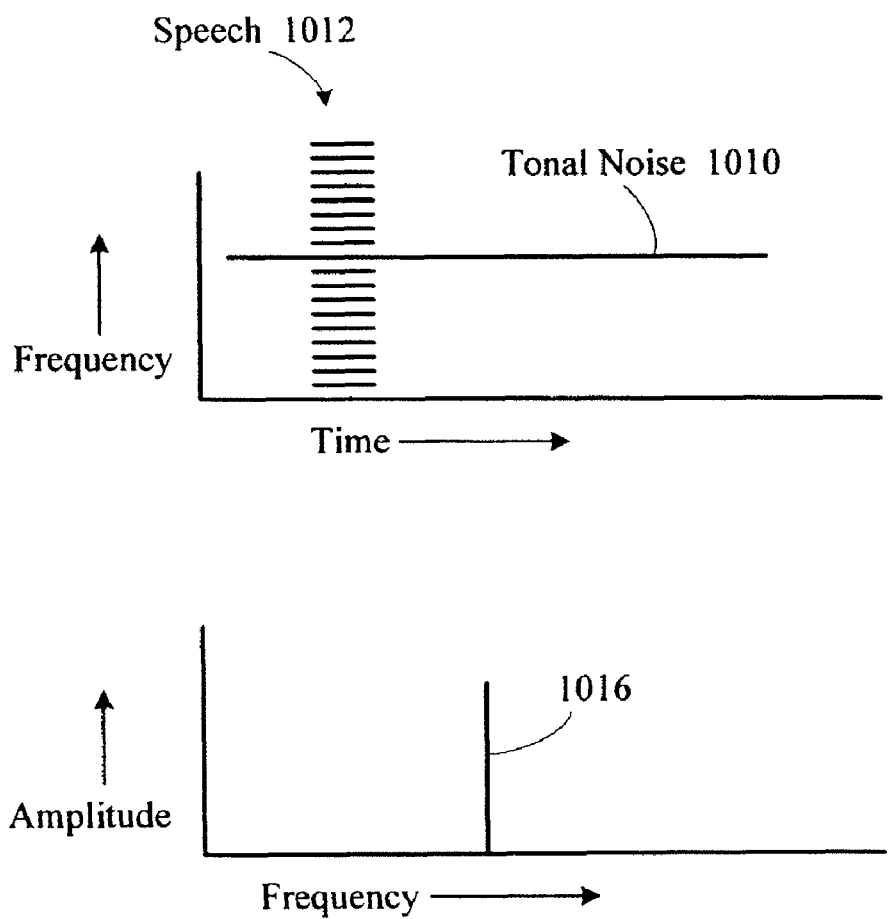
FIG. 10 is a tonal noise.

FIG. 9 shows the periodic sub-band enhancement circuit 720 having a tonal noise detector 910. Tonal noise may be present in the input signal x(n). Because tonal noise may be periodic, it may be difficult to distinguish from speech signals. Tonal noise may be caused by equipment, and may have a constant frequency. A "beep" or tone from electronic devices may constitute tonal noise. FIG. 10 shows tonal noise 1010 and a speech signal 1012 in a spectrogram in the upper panel. Tonal noise 1010 may appear as a thin "streak" in the spectrogram. In the frequency domain, tonal noise may appear as a spike 1016 in a particular frequency range, shown in the lower panel.

The tonal noise detector 910 may detect the presence of tonal noise in a sub-band range. The tonal noise detector 910 may monitor the maximum value of the adaptive filter coefficients. If the maximum value of the coefficients is greater than a predetermined value for a predetermined period of time T, the tonal noise detector 910 may detect the presence of tonal noise. The pitch of speech, and in particular the pitch of vowel sounds, may be expected to vary within a particular period of time. A vowel sound may remain constant, but only for a fairly short period of time. In contrast, a tonal noise sound may remain constant for a longer period of time. The predetermined period of time T may be set to a value larger than the expected length of vowel sounds occurring in natural speech.

When the tonal noise detector 910 detects tonal noise, the tonal noise detector may direct the adaptive filter system 840 to stop adaptation of the filter coefficients. Alternatively, the tonal noise may be minimized. To minimize the tonal noise, a multiplier circuit 844 may scale the output of the adaptive filter system 840 by a negative component $B_i$ of the tonal noise. The negative component $B_i$ of the tonal noise may range from about minus one to about zero. A value of minus one may indicate that the tonal noise is minimized or cancelled. A value of zero may indicate that output of the adaptive filter system 840 may be unmodified.

The signal enhancement systems 200, 600, 700 and 720 may be implemented in hardware, software, or a combination of hardware and software. The enhancement systems 200, 600, 700 and 720 may take the form of instructions stored on a machine-readable medium such as a disk, flash card, or other memory. The enhancement systems 200, 600, 700 and 720 may be incorporated into communication devices, sound systems, gaining devices, signal processing software, or other devices and programs.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A signal enhancement system, comprising:
    a delay logic circuit configured to receive an input signal and generate a delayed signal;
    an adaptive filter circuit coupled with the delay logic circuit and configured to receive the delayed signal and generate an output signal based on the delayed signal and filter coefficients of the adaptive filter circuit, where the adaptive filter circuit is configured to adapt the filter coefficients based on a difference between the output signal and the input signal; and
    a reinforcement logic circuit coupled to the adaptive filter circuit, where the reinforcement logic circuit is configured to add the input signal and the output signal from the adaptive filter circuit to increase a first periodic signal component in the input signal that is at least partially in-phase with a second periodic signal component in the output signal.

2. The signal enhancement system of claim 1, where the delay logic circuit is a first delay logic circuit, the adaptive filter circuit is a first adaptive filter circuit, and the reinforcement logic circuit is a first reinforcement logic circuit, the system further comprising:
    a filter bank configured to divide an input signal frequency spectrum into a plurality of sub-bands, where the input signal processed by the first delay logic circuit, the first adaptive filter circuit, and the first reinforcement logic circuit is a first sub-band input signal of the plurality of sub-bands;
    a second delay logic circuit configured to receive a second sub-band input signal of the plurality of sub-bands and generate a delayed second sub-band signal;
    a second adaptive filter circuit coupled with the second delay logic circuit and configured to receive the delayed second sub-band signal and generate a sub-band output signal based on the delayed second sub-band signal and filter coefficients of the second adaptive filter circuit; and
    a second reinforcement logic circuit coupled to the second adaptive filter circuit, where the second reinforcement logic circuit is configured to add the second sub-band input signal and the sub-band output signal from the adaptive filter circuit to increase a first periodic signal component in the second sub-band input signal that is at least partially in-phase with a second periodic signal component in the sub-band output signal.

3. The signal enhancement system of claim 2, further comprising a synthesis filter bank configured to receive a first reinforced sub-band signal from the first reinforcement logic circuit, receive a second reinforced sub-band signal from the second reinforcement logic circuit, and reconstruct a reinforced output signal from the first reinforced sub-band signal and the second reinforced sub-band signal.

4. The signal enhancement system of claim 2, where at least one sub-band of the plurality of sub-bands has a bandwidth different than an adjacent sub-band.

5. The signal enhancement system of claim 2, further comprising a multiplier circuit coupled between the second adaptive filter circuit and the second reinforcement logic circuit, where the multiplier circuit is configured to control an amount of enhancement applied to the sub-band output signal.

6. The signal enhancement system of claim 5, where the amount of enhancement applied is a multiplier factor having a value between about zero and about one.

7. The signal enhancement system of claim 2, where the filter bank comprises a plurality of Gammatone-type bandpass filters.

8. The signal enhancement system of claim 2, where the filter bank is configured to generate the plurality of sub-bands by down-sampling.

9. The signal enhancement system of claim 2, further comprising a tonal noise detector in communication with the first adaptive filter circuit, where the tonal noise detector is configured to monitor the filter coefficients of the first adaptive filter circuit to detect tonal noise.

10. The signal enhancement system of claim 9, where the tonal noise detector is configured to inhibit adaptation of the first adaptive filter circuit when tonal noise is detected.

11. The signal enhancement system of claim 9, where the tonal noise detector is configured to minimize the tonal noise by applying a negative component of the tonal noise to an output of the first reinforcement logic circuit.

12. The signal enhancement system of claim 1, where the input signal comprises an audio signal, and where the output signal from the adaptive filter circuit that is added together with the input signal is a delayed and filtered version of the input signal.

13. A method for enhancing a signal, comprising:
    delaying an input signal to generate a delayed signal;
    adaptively filtering the delayed signal, by an adaptive filter implemented in hardware or executed by a processor, to generate an output signal based on the delayed signal and filter coefficients of the adaptive filter;

adapting the filter coefficients of the adaptive filter based on a difference between the output signal and the input signal; and reinforcing the input signal with the output signal to generate a reinforced signal, where the act of reinforcing comprises adding the input signal and the output signal from the adaptive filter to increase a first periodic signal component in the input signal that is at least partially in-phase with a second periodic signal component in the output signal.

14. The method of claim 13, where the adaptive filter is a first adaptive filter, the method further comprising:

dividing an input signal frequency spectrum into a plurality of sub-bands, where the input signal processed by the first adaptive filter is a first sub-band input signal of the plurality of sub-bands;

delaying a second sub-band input signal of the plurality of sub-bands to generate a delayed second sub-band signal;

adaptively filtering the delayed second sub-band signal, by a second adaptive filter implemented in hardware or executed by a processor, to generate a sub-band output signal based on the delayed second sub-band signal and filter coefficients of the second adaptive filter;

reinforcing the second sub-band input signal with the sub-band output signal to generate a reinforced signal, where the act of reinforcing comprises adding the second sub-band input signal and the sub-band output signal from the second adaptive filter to increase a first periodic signal component in the second sub-band input signal that is at least partially in-phase with a second periodic signal component in the sub-band output signal.

15. The method of claim 14, where at least one sub-band of the plurality of sub-bands has a bandwidth different than an adjacent sub-band.

16. The method of claim 14, where the act of dividing the input signal frequency spectrum comprises providing a Gammatone filter to separate the input signal.

17. The method of claim 14, further comprising monitoring the filter coefficients of the first adaptive filter to detect tonal noise.

18. The method of claim 17, further comprising detecting tonal noise based on a maximum value of the filter coefficients of the first adaptive filter.

19. The method of claim 17, further comprising inhibiting adaptation of the first adaptive filter when tonal noise is detected.

20. The method of claim 13, where the input signal comprises an audio signal, and where the output signal that is added together with the input signal is a delayed and filtered version of the input signal.

21. A machine-readable non-transitory medium having processor-executable instructions to enhance a signal by performing the acts of:

delaying an input signal to generate a delayed signal;

adaptively filtering the delayed signal to generate an output signal based on the delayed signal and filter coefficients of an adaptive filter;

adapting the filter coefficients of the adaptive filter based on a difference between the output signal and the input signal; and reinforcing the input signal with the output signal to generate a reinforced signal, where the act of reinforcing comprises adding the input signal and the output signal from the adaptive filter to increase a first periodic signal component in the input signal that is at least partially in-phase with a second periodic signal component in the output signal.

22. The machine-readable non-transitory medium of claim 21, where the adaptive filter is a first adaptive filter, where the processor-executable instructions further perform the acts of:

dividing an input signal frequency spectrum into a plurality of sub-bands, where the input signal processed by the first adaptive filter is a first sub-band input signal of the plurality of sub-bands;

delaying a second sub-band input signal of the plurality of sub-bands to generate a delayed second sub-band signal;

adaptively filtering the delayed second sub-band signal to generate a sub-band output signal based on the delayed second sub-band signal and filter coefficients of a second adaptive filter;

reinforcing the second sub-band input signal with the sub-band output signal to generate a reinforced signal, where the act of reinforcing comprises adding the second sub-band input signal and the sub-band output signal from the second adaptive filter to increase a first periodic signal component in the second sub-band input signal that is at least partially in-phase with a second periodic signal component in the sub-band output signal.

23. The machine-readable non-transitory medium of claim 21, where the input signal comprises an audio signal, and where the output signal that is added together with the input signal is a delayed and filtered version of the input signal.

* * * * *